(12) United States Patent
Ramlall et al.

(10) Patent No.: US 11,913,975 B2
(45) Date of Patent: Feb. 27, 2024

(54) CURRENT SENSOR DEVICE AND METHOD FOR ASSEMBLING SUCH A DEVICE

(71) Applicant: MERSEN FRANCE AMIENS SAS, Amiens (FR)

(72) Inventors: Radjy Ramlall, Lamentin (FR); Benoit White, River Edge, NJ (US)

(73) Assignee: MERSEN FRANCE AMIENS SAS, Amiens (FR)

( * ) Notice: Subject to any disclaimer, the term of this patent is extended or adjusted under 35 U.S.C. 154(b) by 250 days.

(21) Appl. No.: 17/596,969

(22) PCT Filed: Apr. 29, 2021

(86) PCT No.: PCT/FR2021/050740
§ 371 (c)(1),
(2) Date: Dec. 22, 2021

(87) PCT Pub. No.: WO2021/219962
PCT Pub. Date: Nov. 4, 2021

(65) Prior Publication Data
US 2022/0268813 A1 Aug. 25, 2022

(30) Foreign Application Priority Data

Apr. 30, 2020 (FR) ...................................... 2004293

(51) Int. Cl.
*G01R 15/20* (2006.01)
*G01R 19/00* (2006.01)

(52) U.S. Cl.
CPC ......... *G01R 15/202* (2013.01); *G01R 15/207* (2013.01); *G01R 19/0092* (2013.01)

(58) Field of Classification Search
CPC ................ G01R 15/202; G01R 15/207; G01R 19/0092; G01R 31/343; Y02E 10/72; H02K 5/148; H02K 11/27; H01R 39/38
(Continued)

(56) References Cited

U.S. PATENT DOCUMENTS

| 11,340,268 B2 * | 5/2022 | Wriessnegger ...... G01R 15/207 |
| 11,637,483 B2 * | 4/2023 | Noguchi ................ H02K 11/33 |
| | | 310/68 B |

(Continued)

FOREIGN PATENT DOCUMENTS

| CN | 102169136 A | 8/2011 |
| CN | 107861062 A | 3/2018 |
| RU | 2 157 033 C1 | 9/2000 |

OTHER PUBLICATIONS

International Search Report for PCT/FR2021/050740 dated Oct. 26, 2021 (PCT/ISA/210).

*Primary Examiner* — Giovanni Astacio-Oquendo

(74) *Attorney, Agent, or Firm* — Sughrue Mion, PLLC

(57) ABSTRACT

The invention relates to a current sensor device for monitoring the current flowing through a brush, comprising: —a brush holder (12) extending in a longitudinal direction and defining a through-housing intended to accommodate a brush such that one end of the brush which is intended to brush against a rotating movable surface protrudes from the brush holder, a Hall effect sensor (14) arranged to detect a magnetic field; —a concentrator (16) for concentrating the magnetic fields in a concentrated magnetic field zone and for protecting the zone from external magnetic fields, in which: —the concentrator (16) is mounted on the brush holder (12) so as to surround at least part of the housing of the brush holder; —the Hall effect sensor is mounted on the brush holder (12) at a position located inside the concenrated magnetic field zone.

16 Claims, 4 Drawing Sheets

(58) Field of Classification Search
USPC .................................. 324/126, 76.11, 500
See application file for complete search history.

(56) References Cited

U.S. PATENT DOCUMENTS

2014/0346931 A1    11/2014  Fish et al.
2019/0229640 A1*    7/2019  Aichriedler ........... H02M 7/003

* cited by examiner

CURRENT SENSOR DEVICE AND METHOD FOR ASSEMBLING SUCH A DEVICE

CROSS REFERENCE TO RELATED APPLICATIONS

This application is a National Stage of International Application No. PCT/FR2021/050740 filed Apr. 29, 2021, claiming priority based on French Patent Application No. 2004293 filed Apr. 30, 2020, the entire contents of which are incorporated by reference herein.

The invention relates to measuring the electric current passing through a brush intended to provide an electrical contact between a fixed part/element and a movable part/element. The invention can find an application for example in rotating electrical machines, in particular asynchronous ones, motors, generators, in particular wind-turbine generators.

A brush is a sliding electrical contact transmitting the electric current between a fixed part/element and a rotating part/element, or vice versa. The brushes may be used in electrical apparatus such as generators or electric motors, the rotating element of which may be a collector or a set of collecting rings. In general, a brush consists of one or more blocks of conductive material, generally graphite based, usually provided with a cable. These brushes are supported by brush holders.

The operation of the brushes may depend on numerous parameters such as the ambient temperature, the state of the contact surface, the current that passes through each brush, the vibrations, etc. In a high-power machine, a plurality of brushes are electrically connected in parallel. The current is thus distributed between the various brushes, which may interfere with the operation thereof in the event of asymmetric distribution of the current: a brush with a low current passing through it will act as an abrasive stone, while another brush through which a high current passes will heat up. The electrical resistance of the latter will increase, in particular at the point of connection with the electric cable to which it is connected, which may cause disconnection of the brush by pulling out the cable, and increase the electric current passing through the other brushes, and ultimately a possible pulling out of all the cables connected to the brushes.

This is the reason why, since several years, monitoring the current passing through the brushes has proved to be essential for the users of a rotating electrical machine.

The current passing through the brushes can be monitored by a current sensor resistor ("shunt sensor" or "current-sense resistor"). This system has the advantage of being inexpensive and widely used. However, some of the current may be lost and monitoring each brush is difficult because of the large size of the device.

Using a Hall effect sensor for measuring the current passing through a brush is known. A Hall effect sensor is sensitive to the magnetic flux created by a flow of current and generates a voltage representative of this current. Such sensors have the advantage of not interfering with the current to be measured. However, disturbances and losses are observed due to the sensitivity of these sensors to the magnetic environment and to the external sources of magnetism. Furthermore, the mountings are often relatively complex, these sensors being in general mounted on the cables supplying the brushes.

The document CN102169136 describes in particular a device for the online monitoring of the current of a brush in a generator. This device comprises a Hall effect sensor installed upstream of the brush, on the power supply plate connecting the cable of the brush to the brush holder. The Hall effect sensor therefore does not measure the current passing through the brush, but only the one passing through the power supply plate.

Using a Hall effect sensor for measuring the current of a cable connected to a brush is also known. Thus the document RU2157033C1 describes a tool for measuring the current of a cable connected to a brush. This tool however requires the intervention of an operator and cannot measure the current passing through the block of the brush, but only the one passing through the cable connected to the brush.

The document CN107861062b describes a device for the online monitoring of a generator using a Hall effect sensor located between two ends of a ring supporting a winding, or in other words an active torus. The output signal of the sensor of the Hall effect sensor represents a change in the value of the current passing through one or more brushes. The Hall effect sensor therefore does not measure a current value. This document also does not specify the position of the Hall effect sensor.

A need therefore exist for a current sensor device that makes it possible to monitor a brush in a rotating electrical machine that is reliable and efficient. A need also exists for a current sensor device that is compact, inexpensive and easy to mount.

A current sensor device is proposed for monitoring the current passing through a brush, comprising:
- a brush holder extending in a longitudinal direction between distal and proximal ends, and defining a through housing intended to receive, slidably in the longitudinal direction, a brush so that one end of the brush intended to slide so against a rotating movable surface protrudes from the brush holder on the same side as its distal end,
- a Hall effect sensor arranged to detect a magne$^2$tic field,
- a concentrator arranged to concentrate the magnetic fields inside a concentrated magnetic field zone and to protect this zone from the external magnetic fields, wherein the concentrator is mounted on the brush holder so as to surround at least a part of the brush when the latter is received inside the housing of the brush holder, in particular in a plane perpendicular to the longitudinal direction,
- the Hall effect sensor is mounted on the brush holder at a position located inside the concentrated magnetic field zone, so as to measure a value representative of the intensity of the current passing through the brush when the latter is received in the housing of the brush holder.

The concentrator thus surrounds at least a part of the brush when the latter is received in the housing of the brush holder so that the magnetic field generated by the current flow passing through the brush is concentrated by the concentrator. The presence of the concentrator allows concentrating and increasing the magnetic flux generated by the current passing through a brush received in the housing of the brush holder, thus improving the accuracy of the measurement. The concentrator also allows protecting the Hall effect sensor from the influence of magnetic fields coming from external sources.

Furthermore, such an arrangement is compact, allowing providing one current sensor per brush holder and therefore per brush, improving the monitoring of a rotating electrical machine equipped with a plurality of brushes.

It will be noted that the concentrator can be mounted outside the brush holder so as to at least partially surround the housing. It then surrounds walls of the brush holder defining the housing. The concentrator can also be mounted inside the brush holder so as to at least partially surround the housing. In this case, it can at least partially define the housing and be itself surrounded by the walls of the brush holder. In other words, in all cases, the concentrator is mounted on the brush holder so as to at least partially surround a brush so disposed inside the housing.

Advantageously, the Hall effect sensor may be sensitive to a magnetic field extending parallel to its surface. This is for example the case with sensors using IMC-Hall® (Integrated Magneto-Concentrator) technology. This type of sensor can then be positioned so as to extend parallel to the longitudinal direction of the brush holder so as to measure an electric current circulating in the longitudinal direction. This makes it possible to limit further the size of the current sensor device.

The Hall effect sensor and the concentrator can be positioned at any point on the brush holder in the longitudinal direction thereof. However, at the proximal end of the brush holder, namely opposite to the distal end in proximity to which the end of the brush sliding against a rotating movable surface is located, the current passing through the brush circulates in three directions: in the longitudinal direction, but also in two directions of a plane perpendicular to the longitudinal direction. When it is placed in this region, the Hall effect sensor will therefore not measure the whole of the current.

Thus, advantageously, for better accuracy of the measurement, the concentrator and the Hall effect sensor can be located at a position closer to the distal end than to the proximal end of the brush holder in the longitudinal direction. In use, the concentrator and the Hall effect sensor are then located at a position closer to the end of the brush sliding against a rotating movable surface. In this region of the brush, the current circulates in an essentially longitudinal direction, so that all or almost all of the current passing through the brush can be measured. In particular, the concentrator and the Hall effect sensor can be located at the distal end of the brush holder.

The concentrator may entirely surround a brush received in the housing of the brush holder in a plane perpendicular to the longitudinal direction or have an open form.

Advantageously, the housing may have a cross section in the form of a quadrilateral in a plane extending perpendicular to the longitudinal direction of the brush holder, and the concentrator can thus surround a brush received inside the housing on at least three sides of the quadrilateral shape of the housing in this same plane, or even partially or totally on the fourth housing side. Such a shape for the concentrator is simple to implement and allows a particular effective concentration of the magnetic field created by the current passing through the brush while limiting the interferences coming from a magnetic field generated by adjacent brushes and/or coming from external sources. The concentrator may in particular have a U shape, the sensor advantageously being positioned between the wings of the U, particularly halfway between them, at the opening of the U.

In general terms, the concentrator can adopt the shape of the brush holder and be applied against walls forming the latter, outside or inside the brush holder.

Advantageously, the Hall effect sensor can be attached to a sensor holder located inside a casing mounted on the brush holder so that the Hall effect sensor is mounted removably on the brush holder. This removable mounting of the Hall effect sensor can result in a removable mounting of the casing on the brush holder, of the sensor support on the casing, or both. The Hall effect sensor can thus easily be mounted/removed on or from the brush holder, which allows easy and rapid installation or even replacement. For example, the casing receiving the sensor support can be fixed by snapping onto the brush holder or the sensor support can be inserted like a cartridge inside the casing.

Thus at least one element selected from the casing and the sensor support can be mounted removably, in particular without tools. This removable mounting can for example be implemented by means of male or female members cooperating with corresponding female/male members of the brush holder or of the casing. These corresponding male/female members may for example be selected from a sliding rail/finger, snapping-on orifice/finger, snapping-on orifice/lug, other types of male/female members of the slider/rail type or the like, and combinations thereof.

In a variant, the Hall effect sensor could be mounted fixedly (non-removably) on the brush holder, either directly (by gluing or the like), or via a sensor support mounted fixedly on the brush holder (by gluing, screwing or the like), or via a sensor support located inside a casing mounted fixedly on the so brush holder (by gluing, screwing or the like).

In general, the sensor support can extend parallel to the longitudinal direction, preferably parallel to a face of the brush holder.

Advantageously, the sensor support may be or comprise a printed circuit board. The sensor support is then in the form of a board carrying electronic components. The Hall effect sensor can then be attached to the face of the printed circuit carrying the electronic components and positioned opposite the brush holder. This printed circuit board may, for example, be inserted by sliding inside the casing mounted on the brush holder.

Advantageously, the printed circuit board can then include at least one microprocessor or microcontroller for analyzing the data supplied by the Hall effect sensor. The current sensor device can then furthermore comprise a connection member arranged to collect and transmit to a data management system the data analyzed by the at least one microprocessor or microcontroller.

Advantageously, to facilitate the mounting of the concentrator, the latter may also preferably be mounted without tools and/or removably on the brush holder. For example, the concentrator may be attached to the brush holder by means of a support element attached to the brush holder, in particular without tools and/or removably. This support element may also be arranged to protect the concentrator.

For rapid mounting, the current sensor device may comprise at least one of the following features:
the brush holder may define at least one holding member cooperating with a holding member of at least one element selected from the casing, the concentrator, the support element,
the casing may define at least one holding member cooperating with a holding member of at least one element selected from the concentrator and the support element,
the support element may define at least one holding member cooperating with a holding member of at least one element selected from the brush holder, the casing and the concentrator.

In particular, these holding members may be arranged to block a relative movement of the parts that they hold at least in the longitudinal direction, or even in all directions in the space.

These holding members may be selected from a stop, a housing, an orifice, a male member and a female member, cooperating respectively with an edge or a protrusion, an element part, a female member and a male member.

The male members may comprise a finger, a lug, a tongue, a screw, a pin or similar. The female members may comprise an orifice, a slot, a rail or similar.

Advantageously, the length of the concentrator in the longitudinal direction represents 50% or less of the length of the brush holder, optionally from the distal end of the brush holder, in particular 40% or less, 30% or less or 25% or less.

Advantageously, for better efficiency of the concentrator, the length of the concentrator in the longitudinal direction may be equal to or greater than the corresponding length of the Hall effect sensor, preferably at least equal to this length. Optionally, for optimum efficacy, the Hall effect sensor may be at a position located in at least one midplane with respect to the concentrator, this midplane being selected from a midplane parallel to the longitudinal direction and a midplane perpendicular thereto.

The functions of concentration of the magnetic fields and of protection of the concentrator can be obtained by any suitable material, in particular ferromagnetic, this material optionally being able to have a particular structure, for example a laminated structure or any other adapted structure.

Advantageously, the concentrator may be made from a ferromagnetic material.

Advantageously, the current sensor device may comprise at least one other sensor arranged to measure at least one parameter associated with the state of the brush. This parameter is for example selected from a parameter characteristic of the wear on the brush, the temperature of the brush, a parameter representative of the vibrations to which the brush is subjected, a parameter representative of a voltage drop between the brush and the rotating movable surface. The additional sensor or sensors may be secured to the brush so holder, to the sensor support or to the casing receiving the sensor support.

The invention also relates to an assembly comprising a current sensor device as previously described and a brush received slidably in the longitudinal direction inside the housing of the brush holder so that an end of the brush intended to brush against a rotating movable surface protrudes from the brush holder at its distal end.

Another object of the invention is a rotating electric machine comprising at least one current sensor device according to the invention.

In particular, the rotating electric machine may comprise a plurality of brushes and each brush is received inside the housing of the brush holder of a current sensor device, slidably in the longitudinal direction so that an end of the brush intended to slide against a rotating movable surface of the electric machine protrudes from the brush holder at its distal end.

The invention also relates to a method for assembling a current sensor device for monitoring the current of a brush, in particular as described previously, comprising:
  providing a brush holder extending in a longitudinal direction between distal and proximal ends, and defining a through housing intended to receive, slidably in the longitudinal direction, a brush so that an end of the brush intended to slide against a rotating movable surface protrudes from the brush holder at its distal end,
  mounting a concentrator, arranged to concentrate the magnetic fields inside a concentrated magnetic field zone and to protect this zone from the external magnetic fields, on the brush holder so as to surround at least part of the brush when the latter is received inside the housing of the brush holder, in particular in a plane perpendicular to the longitudinal direction, so that the magnetic field generated by the current flow passing through the brush received in the housing of the brush holder is concentrated by the concentrator in a concentrated magnetic field zone,
  mounting on the brush holder a Hall effect sensor arranged to detect a magnetic field, at a position located inside the concentrated magnetic field zone, so as to measure a value representative of the intensity of the current passing through the brush.

In particular, the invention is not limited to a particular order of the steps for mounting the concentrator and the Hall effect sensor.

Advantageously, the mounting of the Hall effect sensor may comprise:
  attaching the Hall effect sensor to a sensor support,
  mounting the sensor support inside a casing,
  mounting the casing on the brush holder.

In particular, the sensor support may be mounted inside the casing without tools and/or removably, and/or the casing may be mounted on the brush holder without tools and/or removably.

The invention is now described with reference to the accompanying non-limitative drawings, wherein.

Figure 9:
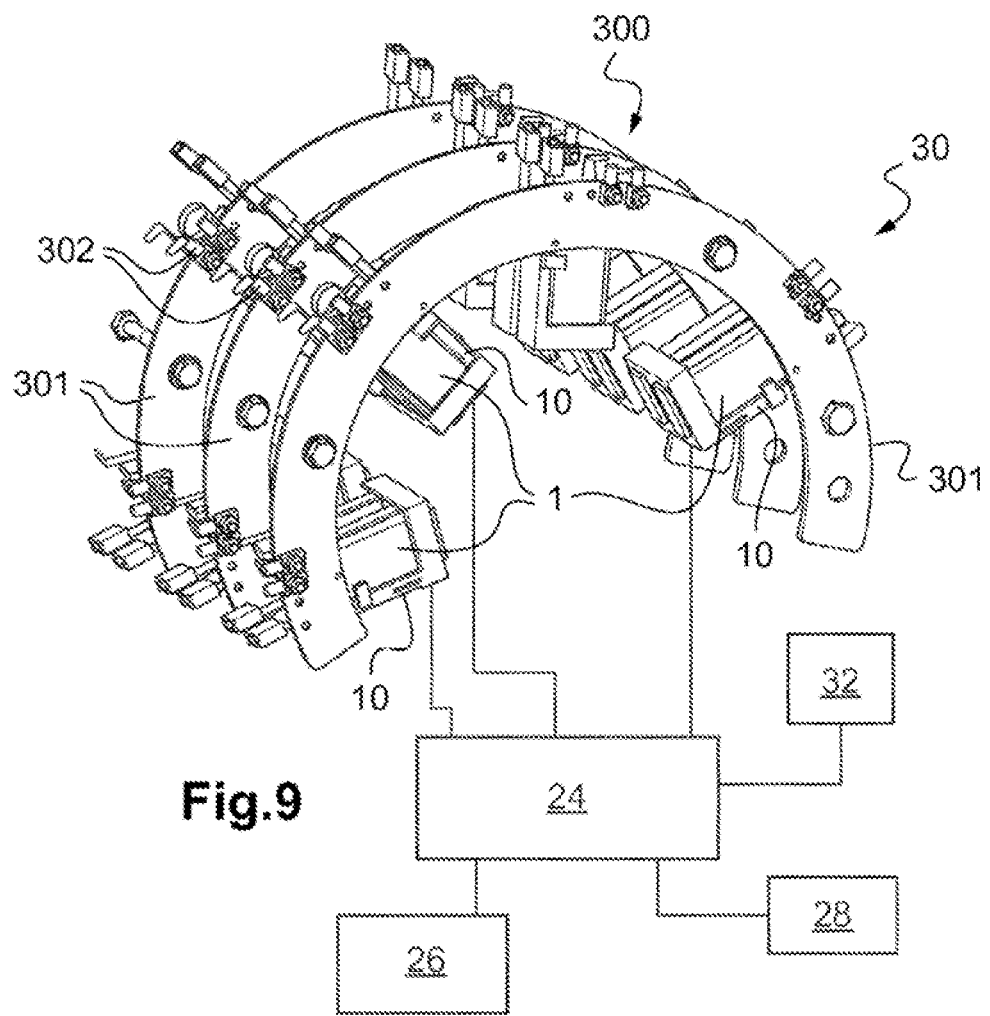

FIG. 9 schematically shows a rotating machine and the electronic architecture controlling the current sensor devices mounted on the rotating machine.

Figure 10:
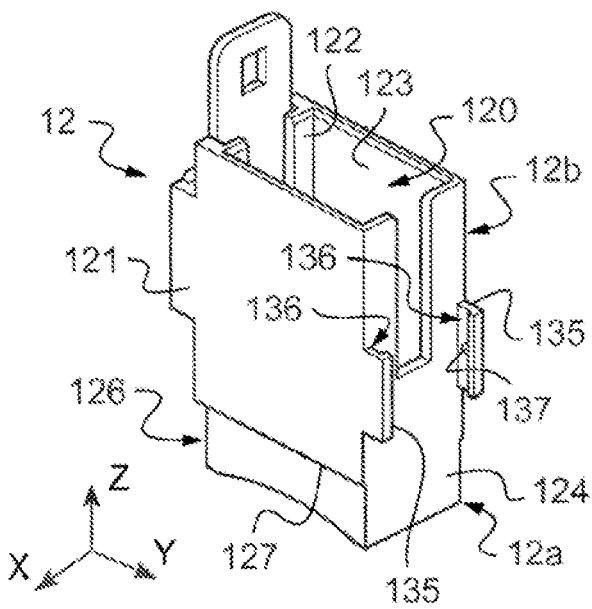

FIG. 10 is a perspective view of the brush holder of the current sensor device according to a variant embodiment.

Figure 11:
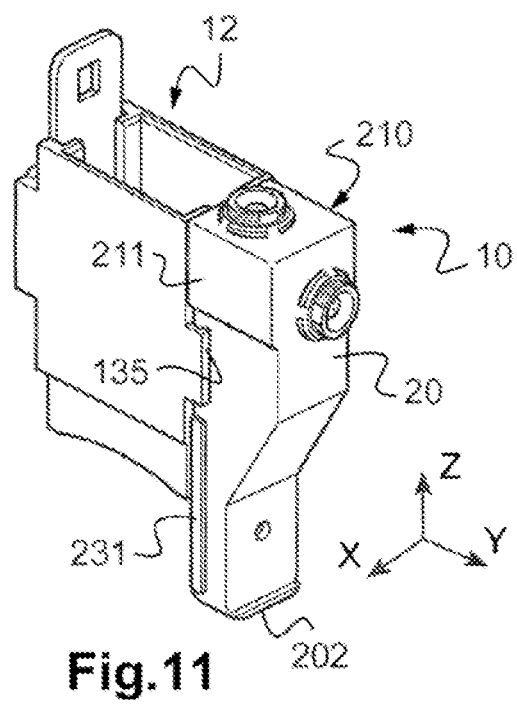

FIG. 11 is a view similar to FIG. 10, also showing a casing in the premounting position.

Figure 12:
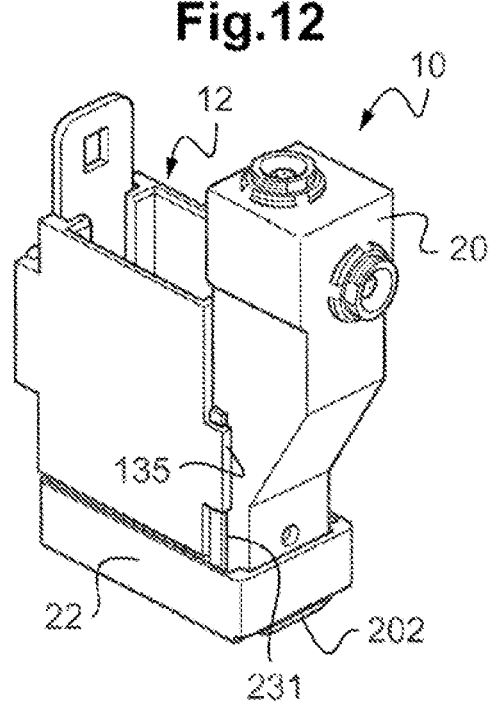

FIG. 12 is a view similar to FIG. 11, after the concentrator and its support element are placed, the casing being in a mounted position.

On the figures, the reference frame X, Y, Z is an orthonormal reference frame.

With reference to FIGS. 1 to 8, a current sensor device 10 for monitoring the current passing through a brush 1 in one embodiment of the invention is described.

This current sensor device 10 comprises:
  a brush holder 12,
  a Hall effect sensor 14 arranged to detect a magnetic field,
  a concentrator 16 arranged to concentrate the magnetic fields inside a concentrated magnetic field zone and to protect this zone from the external magnetic fields.

Figure 1:
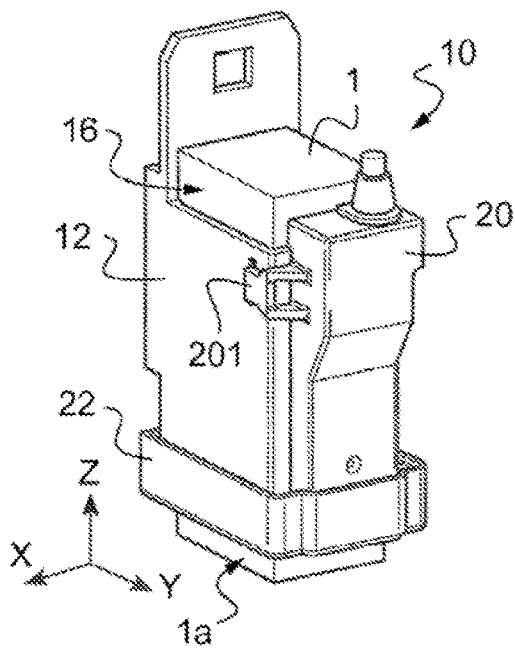
FIG. 1 is a perspective view of a current sensor device according to an embodiment receiving a brush.
Figure 2:
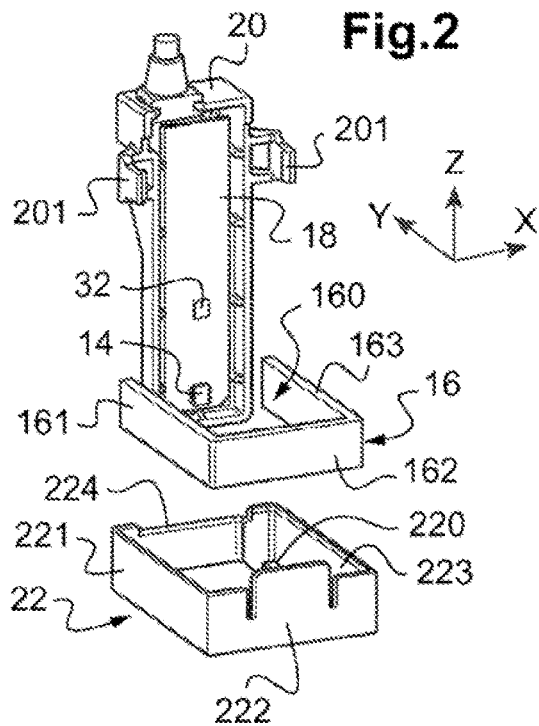
FIG. 2 is an exploded perspective view of the elements mounted on the brush holder of the current sensor device of FIG. 1.
Figure 3:
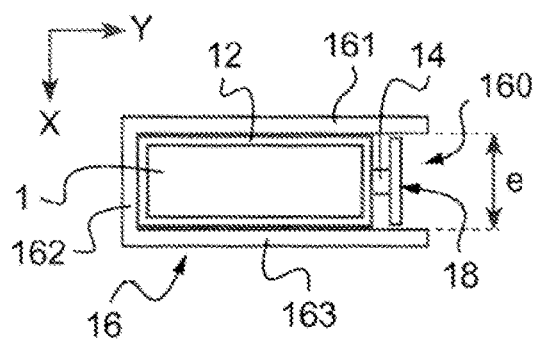
FIG. 3 is a schematic view in cross section of an end of the current sensor device of FIG. 1.
Figure 4:
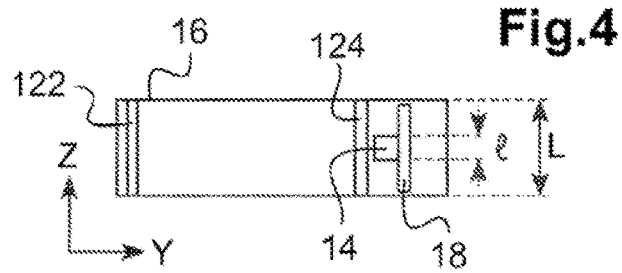
FIG. 4 is a lateral view in cross section of a concentrator and of the Hall effect sensor.
Figure 5:
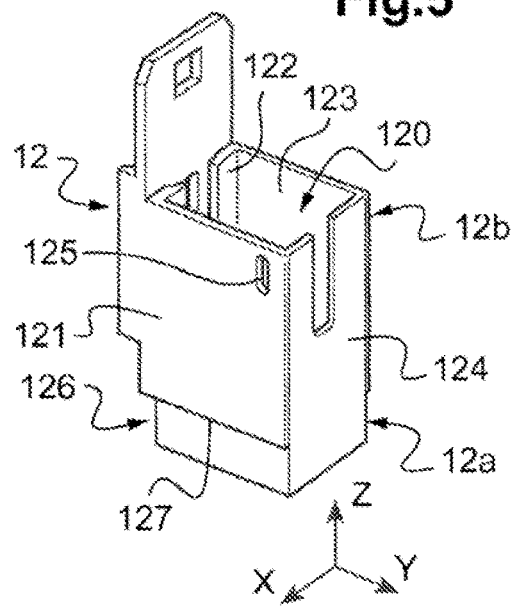
FIG. 5 is a perspective view of the brush holder of the current sensor device of FIG. 1.

The brush holder 12 extends in a longitudinal direction (corresponding to the axis z in the figures) between distal 12a and proximal 12b ends. The brush holder 12 defines a through housing 120 intended to receive the brush 1 slidably in the longitudinal direction, so that a distal end 1a of the brush intended to slide against a rotating movable surface protrudes from the brush holder 12 at its distal end 12a, as shown in FIG. 1. The housing 120 thus also extends in the longitudinal direction z. In general, the longitudinal direction of the brush holder 12 is coincident with the longitudinal direction of a brush 12 received inside the housing 120.

In general, the distal end 1a of the brush 1 protrudes from the distal end 12a of the brush holder 12 in this longitudinal direction z by a few millimeters. Conventionally, the brush holder 12 is produced from a thermally conductive material having good mechanical strength, such as brass, a stainless steel, a copper aluminum alloy or any other suitable material.

Normally, the brush 1 has a parallelepipedal shape, as has the housing 120 that receives it. The housing 120 is in general defined by walls of the brush holder, here four walls 121, 122, 123, 124, extending parallel to the longitudinal direction z.

According to the invention, the concentrator 16 is mounted on the brush holder 12 so as to surround at least part of the brush 1 when the latter is received in the brush holder 12 so that the magnetic field generated by the flow of current passing through the brush is concentrated by the concentrator in a concentrated field zone 160. This concentrated field zone 160 corresponds in particular to a zone located between walls forming the concentrator. Thus the concentrator 16 at least partly surrounds the housing 120 defined by the brush holder 12, in particular in a plane perpendicular to the longitudinal direction z of the brush holder 12.

In the embodiment shown, the concentrator 16 has a U shape in a plane extending perpendicular to the longitudinal direction of the brush holder. Thus three walls 161, 162, 163 are formed, extending parallel to the longitudinal direction z, two walls 161, 163 of which forming the wings of the U shape are parallel to each other and connected by the third wall 162. The concentrator 16 thus surrounds three of the four faces of the brush holder, the concentrated field zone 160 extending between the three walls 161-163. The concentrator 16 is for example formed from a plate of material with a rectangular shape folded in a U.

This U shape has the advantage of being simple to produce and to assemble on the brush holder. The invention is however not limited to this embodiment. It would in particular be possible to envisage a concentrator entirely surrounding the brush holder in a plane perpendicular to the longitudinal direction or a U-shaped concentrator the free ends of the wings of which are curved towards each other parallel to the wall 124, thus having a shape similar to a C.

The concentrator 16 is in a usual manner produced from ferromagnetic material. Ferromagnetic materials that can be envisioned are iron, nickel, SiFe, NiFe, or any other ferromagnetic material. The concentrator may for example be formed of a metal sheet or from a superimposition of metal sheets. It may for example be formed from a plurality of laminated iron and nickel sheets.

A person skilled in the art will be able to determine in a usual manner the thickness of the concentrator according to the amplitude of the current flowing through the brush.

In general, it is preferable for the concentrator 16 to be in abutment against the brush holder, for example applied against the walls 121-124 of the brush holder defining the housing 120 outside the brush holder. The space between the brush holder and the concentrator is thus reduced to a minimum, which makes it possible to position the concentrator as close as possible to the Hall effect sensor and to improve the concentration of the magnetic field. A person skilled in the art will be able to provide a mounting clearance between the concentrator and the brush holder. In an embodiment that is not shown, the concentrator could be in abutment against the walls 121-124 of the brush holder defining the housing 120 inside the brush holder. The concentrator then at least partially defines the housing 120.

According to the invention, the Hall effect sensor is mounted on the brush holder 12 at a position located inside the concentrated magnetic field zone 160, so as to measure a value representative of the intensity of the current flowing through the brush 1.

A Hall effect sensor is sensitive to the magnetic field generated by a circulation of electric current. It converts the magnetic field generated into a voltage proportional to this field. The output of the sensor may be linear to the magnetic field and, because the field is linear to the current in the conductor, the output voltage will provide a linear voltage that is directly proportional to the current. For sensors with a non-linear output, the current can be determined by a chart or an equation, for example integrated in a microprocessor microcontroller. The operation of this type of sensor is well known and will not be detailed further.

Conventional Hall effect sensors detect a magnetic flux perpendicular to their surface, which does not make them possible to mount very close to the conductor in which the current to be measured is circulating.

Although such sensors can be envisioned in the present invention, they are relatively bulky and not very sensitive. It will be preferred to use a Hall effect sensor sensitive to a magnetic field extending parallel to its surface. This type of Hall effect sensor is more sensitive than conventional Hall effect sensors and can be mounted as close as possible to the conductor in which the current to be measured is circulating, thus improving the sensitivity of the sensor. Advantageously it will be possible to use Hall effect sensors with an integrated magnetic concentrator, in other words the Hall effect sensors using the IMC-Hall® (Integrated Magneto-Concentrator) technology. A sensor of this type is manufactured by means of the standard CMOS technology, with an additional ferromagnetic layer characterized by high permeability and a weak (very soft) coercive field that fulfils the role of a magnetic field concentrator. This type of sensor also has the advantage of making possible the measurement of alternating or direct currents.

In order to improve the precision of the measurement, the concentrator 16 and the Hall effect sensor 14 are advantageously located at a position closer to the distal end 12a than to the proximal end 12b of the brush holder 12. In a preferred embodiment, as shown in the figures, the concentrator 16 is attached at the distal end 12a of the brush holder 12, for example along the edge of the walls 121-123 of the brush holder defining the housing 120.

In general, advantageously, the part of the brush holder 12 surrounded by the concentrator 16 extends in the longitudinal direction over a length L that represents 50% or less of the length of the brush holder, in particular from the distal end 12a of the brush holder 12. This length L corresponds to the dimension of the concentrator 16 in the longitudinal direction z. However, advantageously, the length L of the concentrator 16 in the longitudinal direction is at least equal to the length C of the Hall effect sensor 14, preferably greater than it, for example 1.5 to 3 times greater than the length of the sensor 14. The length L of the concentrator can thus be selected in intervals the minimum value of which is as previously defined and the maximum value of which represents 50%, 40%, 30%, 25% or less of the length of the brush holder.

The sensor 14 will preferably be positioned inside the concentrated magnetic field zone in a median position with respect to the concentrator in a plane perpendicular to the longitudinal direction and in a plane parallel to the longitudinal direction. In other words, as visible in FIGS. 3 and 4, the Hall effect sensor is located halfway across the separation e between the walls 161, 163 of the concentrator and halfway along the concentrator in the longitudinal direction z.

In the embodiment shown, it will be noted that the Hall effect sensor 14 is located between the wings of the U shape, on the same side as its opening, at a short distance therefrom. The Hall effect sensor could be positioned closer to the opening, provided that the sensor remains inside the zone 160 defined by the walls 161-163 of the concentrator. The Hall effect sensor will preferably be positioned as close as possible to the brush holder 12 for better accuracy of measurement, though a mounting clearance can however be provided between the brush holder 12 and the Hall effect sensor.

In the examples shown in FIGS. 1 to 8 and 10 to 12, the Hall effect sensor 14 is attached to a sensor support 18 located inside a casing 20 mounted on the brush holder 12. The casing 20 makes it possible to protect the Hall effect sensor 14, or even the sensor support 18, from the external environment. The mounting is implemented so that the Hall effect sensor is mounted removably on the brush holder.

In the example shown in FIGS. 1 to 8, the Hall effect sensor 14 is attached to the sensor support 18, which is attached to the casing 20, the latter being fitted on the brush holder 12 by means of lugs 201 which are inserted in corresponding orifices 125 in the brush holder. These lugs 201 come into engagement on opposite walls of the brush holder 12. The lugs 201 and the orifices 125 thus form holding members within the meaning of the invention.

The sensor support 18 for its part is mounted inside the casing 20, for example by insertion, interlocking, overmolding, gluing or a combination of these means. In particular, overmolding has the advantage of better protecting the sensor 14 and the sensor support 18 from the environment external to the casing 20.

It will be noted that the face of the casing 20 assembled on the brush holder is not closed, and the casing is thus in the form of a half-shell. Thus the sensor support 18 is located opposite the wall 124 of the brush holder when the casing is mounted on the brush holder, this wall 124 closing the casing 20.

The present invention is not limited to this method of removable attachment of the casing 20 to the brush holder 12 and any other interlocking means, removable or not, functioning by cooperation of male and female members, could be envisaged. The casing could thus be mounted slidably on the brush holder or at the same time mounted slidably with parts interlocked on the brush holder by putting fingers or lugs in engagement with orifices with a corresponding shape. A removable mounting of the sensor support inside the casing by interlocking, by sliding and/or by snapping in could also be envisaged.

Thus FIGS. 10 to 12 show an embodiment that differs from the embodiment in FIGS. 1-8 only through the method of removable attachment of the casing 20 to the brush holder 12, and thus the same elements will be designated by the same references. In this embodiment, the brush holder 12 has, on its wall 124, two guides 135 located facing each other with a L shaped cross section (FIG. 10). In other words, each of these guides 135 defines a groove or slot 136 with the wall 124, thus forming a guide rail therewith. These guides 135 extend in the longitudinal direction z over a part of the height of the brush holder 12. The casing 20 for its part has, on opposite faces 210, 211, two protruding guiding parts 231 also extending parallel to the direction z and translationally received inside each guide 135 like sliders. In the example shown, these guiding parts 231 are in the form of tongues. Furthermore, the guiding parts 231 are not extending over the entire height of the casing 20, facilitating mounting. The invention is however not limited to the form or length of the guides and guiding parts provided that they can cooperate with each other, here in translation. The guiding parts and the guides thus form holding members, respectively of the male and female type, within the meaning of the invention. These holding members cooperate, here by sliding, to implement a removable mounting.

It should be noted that the guides 135 could be secured to the casing 20 and the guiding parts 231 secured to the brush holder.

It will also be possible to provide holding members blocking any translation movement between the casing 20 and the brush holder 12. It may be a screw or a plurality of screws inserted in a direction perpendicular to the translation direction, for example through at least one of the guides and/or guiding parts. This screw may simply come into tight abutment against the casing 20, or a tongue 231, or be inserted in an orifice in the casing 20, for example a simple slot (or discontinuity) provided in a guiding part, or a circular orifice 137 passing through a guide 135 (FIG. 10). It may be a screw having a standard screw head, for example compatible with a flat or cruciform screwdriver, or having a specific form cooperating with a specific screwdriver. Provision will optionally be able to be made to add a spot of glue to prevent unscrewing in the presence of vibrations. The holding members may also be of the pin type held in a blocking position inside an orifice by a spring. This type of holding member may be actuated by a quarter-turn mechanism.

Finally, it will be possible to combine the embodiments in FIGS. 10 to 12 with that of FIGS. 1 to 8.

The concentrator 16 is held on the brush holder 12 by means of a support element 22. This acts as both a support and protection for the concentrator 16. In the examples, it is in the form of a frame defined by walls 221, 222, 223, 224 entirely surrounding the brush holder 12 in a plane perpendicular to the longitudinal direction, these walls extending parallel to the longitudinal direction Z. It also surrounds the concentrator 16 and the casing 20. For good holding and minimum size, the support element 22 matches the external shape of the brush holder 12 equipped with the concentrator and with the casing. The length of the support element 22 in the longitudinal direction is preferably at least equal to the length L of the concentrator for better protection, but a smaller dimension can be envisioned, provided that the support element 22 can ensure holding of the concentrator 16. The support element 22, like the casing 20, is preferably made from polymer material. The support element 22 includes internal stops 220 for holding the concentrator in the longitudinal direction z. These stops thus protrude from the frame perpendicularly to the longitudinal direction z, by a length corresponding to no more than the corresponding dimension of the concentrator. In this way, these stops do not protrude inside the housing 120 of the brush holder when the support element is mounted thereon and do not interfere with the sliding of the brush 1 inside the housing.

In a preferred embodiment, the concentrator 16 is also mounted removably on the brush holder 12, as in the example shown. For this purpose, it is mounted inside the support element 22, which is attached to the brush holder 12 removably.

This removable mounting can be obtained by cooperation of holding members between the brush holder 12 and the concentrator 16 and/or its support element 22, between the casing 20 and the concentrator 16 and/or its support element 22, between the support element 22 and the casing 20, the brush holder 12, the concentrator 16 or two or three of these elements.

These holding members may be selected from a stop or protrusion cooperating with an edge, a tongue or similar of another element, a housing or hollow receiving a part of or all of another element and a male member such as a finger or a lug, cooperating with a female element such as an orifice or a rail.

Thus, in the example, the brush holder 12 has at its distal end 12a a housing 126 on the external side of its walls 121-123 receiving the concentrator 16: the latter can be fitted on the brush holder 12 in the longitudinal direction z as far as the end of the housing 126. The casing 20 has at its end a stop 202 (here a rim) cooperating with an edge of the support element 22, here with an edge of the wall 224 thereof.

In the examples described, the casing 20 can thus be easily mounted, in particular without tools, on the brush holder 12, and reversibly. This can make it possible to equip a brush holder and/or to replace a defective casing after putting in operation. It would however be possible to envision a fixed mounting of the casing on the brush holder although this is not preferred, or even to integrate the casing with the brush holder or integrate the sensor support directly with the brush holder.

Assembling a current sensor device for monitoring the current of a brush is now described with reference to FIGS. 5 to 8 and 10 to 12. First of all a brush holder 12 as previously described is provided.

Next the Hall effect sensor 14 is mounted on the brush holder 12. For this purpose, the first step is to attach the Hall effect sensor 14 to the sensor support 18 and then the sensor support 18 is mounted inside the casing 20. The sensor support 18 can be held in the casing by interlocking, by sliding and/or snapping in and/or by means of a polymer material completely or partly covering it. The casing 20 thus equipped is next fixed to the brush holder 12. In the example, it is first of all held in a premounting position shown in FIG. 6 or 11, wherein it is in abutment against the wall 124 of the casing in a position enabling the support element 22 of the concentrator 16 to be placed around the casing and the brush holder 12. In the examples, this is a position (FIG. 6) wherein the lugs 201 of the casing 20 are located below, in the direction z, the orifices 125 of the brush holder wherein they must be inserted or a position (FIG. 11) wherein the guiding parts 231 of the casing 20 are located below, in the direction z, the guides 135 of the brush holder wherein they must be inserted.

Figure 6:
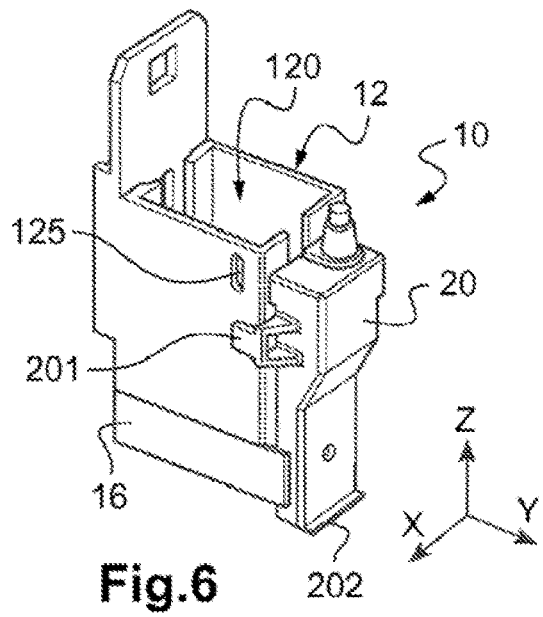
FIG. 6 is a view similar to FIG. 5, also showing a casing in the premounting position and a concentrator.

Next the concentrator 16 is mounted on the brush holder 12 so as to surround at least a part of a brush inserted in the housing 120 of the brush holder (see FIG. 6). For this purpose, the U-shaped concentrator is fitted on the brush holder 12 by the distal end 12a thereof in the longitudinal direction z. Here the concentrator 16 is received in the housing 126 provided on the external face of the walls 121-123 of the brush holder 12 and comes into abutment against the bottom of this housing (step 127 visible in FIG. 5). The support element 22 can then be put in position: it is first of all sloped in order to pass the stop 202 of the casing and then straightened up in order to be able to be fitted, in the longitudinal direction, on the concentrator and the casing 20, as shown in FIG. 7.

Figure 7:
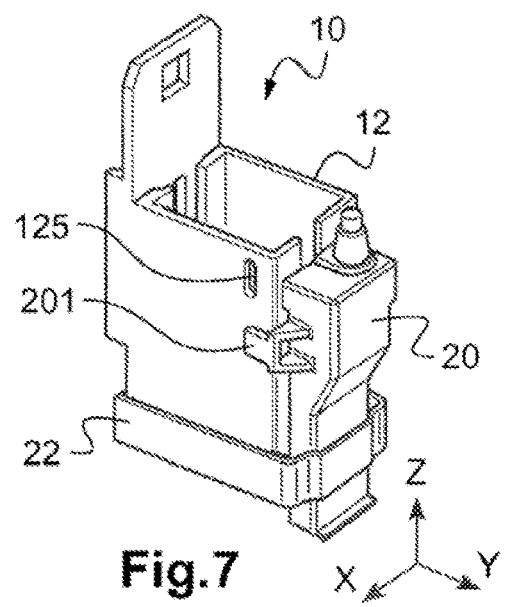
FIG. 7 is a view similar to FIG. 6 after the concentrator and its support element are placed.

Alternatively, for a simpler mounting, the concentrator 16 can be positioned inside the support element 22 and then the latter positioned around the brush holder 12 and the casing 20 by sloping and moving in the longitudinal direction z in order to arrive at the mounting in FIG. 7, as described above.

Figure 8:
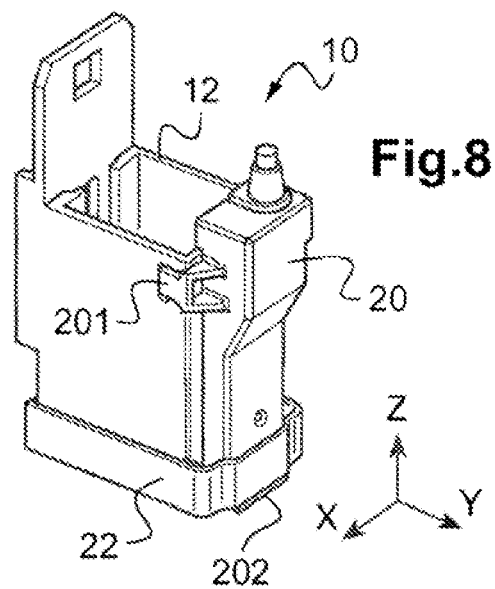
FIG. 8 is a view similar to FIG. 7, the casing being in a mounted position.

The casing 20 is next moved longitudinally until its stop 202 comes into engagement with the support element 22, holding the latter in position in the longitudinal direction z (see FIGS. 8 and 12). Naturally, the stop 202 could also be provided on the brush holder, for example on the edge of the wall 122 thereof.

Naturally, the invention is not limited to a particular order of mounting the various parts, which can differ according to the configuration of these parts and of the holding members.

The sensor support 18 is here an integrated circuit board comprising at least one microprocessor or microcontroller (not shown) for analyzing the data supplied by the Hall effect sensor. The sensor support 18 will preferably be positioned on the face of the integrated circuit board carrying the electronic components, this face being located facing the brush holder 12.

The current sensor device 10 then advantageously comprises a connection member 24 arranged to collect and transmit, to a data management system 26, the data analyzed by the at least one microprocessor or microcontroller. The microprocessor or microcontroller in particular implements a processing of the signal received by the Hall effect sensor, using for example mathematical functions such as quadratic means (RMS, Root Means Square) and transmits the processed signal to the connection member 24, which will collect the data received from the current sensor device 10 to which it is connected and transmit them to the data management system 26. The latter can allow the acquisition, processing and display of the received data. It may comprise one or more processors and display device. It may for example be a computer.

This connection member 24, for example a gateway, may be arranged for a wireless or cable transmission to the data management system 26. The connection member 24 also makes it possible to connect the current sensor device 10 to a power supply 28 supplying the microprocessor or microcontroller, and optionally the Hall effect sensor. The connection member 24, the data management system 26 and the power supply 28 may be common to a plurality of current sensor devices of an electrical rotating machine.

The current sensor devices 10 described can be integrated in a fixed part 300 of an electrical rotating machine 30. This fixed part may be a stator, a fixed coil, fixed equipment electrically connected to the brush cables, or the like. The fixed part 300, shown partially in FIG. 9, comprises ring portions 301, each ring portion supporting a plurality of brush holders 10 and current connectors 302. The fixed part 300 normally surrounds a rotating part (not shown) of the electrical machine 30. This rotating part may for example be a rotating shaft, a rotating ring collector, or the like, with the same axis as the axis of the ring portions 301.

The invention and its embodiments have the following advantages:
1) The Hall sensor is protected from the external sources of magnetism and is not intrusive, so that it measures the current through the brush with great efficacy;

2) High currents (high amplitude) can be measured, with a linear response up to 600 A.
3) When the current is measured at the distal end, where it circulates in a radial direction, the total current through the cross section of the brush is measured.
4) The current sensor device is compact.
5) The current sensor device is also easy to mount/dismantle, in particular without a tool.

With the current sensor device according to the invention, it is possible to measure a current up to 600 A, with a maximum difference of ±30 A, which corresponds to an accuracy of ±5%, or even ±2%. Higher currents could be measured by increasing the thickness of the concentrator.

The current sensor device may also include one or more other sensors 32 (shown schematically in FIGS. 2 and 9) making it possible to measure at least one parameter associated with the state of the brush. It is thus possible to monitor in real time the complete performances of a brush.

This parameter can be selected from a parameter characteristic of the wear on the brush, for example a brush length or a brush position, the temperature of the brush, a parameter representative of the vibration to which the brush is subjected, or a parameter representative of a voltage drop between the brush and the rotating movable surface.

Brush wear can be determined by means of a position sensor such as a Reed contact. A Reed contact (or Reed switch or flexible-blade switch) is a magnetic switch comprising two blades made from magnetic material sealed inside a glass tube containing a neutral gas. The blades are disposed with a slight overlap at the contacts inside the glass, spaced apart by a few hundredths of a millimeter between them (air gap). When the switch is placed in a magnetic field, the blades become magnetized by influence and attract each other mutually until contact. Suppression of the magnetic field causes the separation of the blades. The magnetic field can be produced by approaching a magnet secured to the brush. This magnet can be located at one end of the brush or at any other position inside the brush corresponding to a particular wear position.

The wear on the brush can also be determined by means of a position sensor such as a Hall effect sensor, interacting by means of a magnetic field or by induction with an element such as a magnet or an inductive reactor disposed inside the brush.

Such position sensors can be attached to the brush holder or to the sensor support.

Vibrations can be detected by means of an accelerometer, attached to the brush, to the brush holder, to the sensor support or to a pressure system coming into abutment on the brush in order to maintain it in contact with the rotating movable surface.

The voltage drop between the brush and the rotating movable surface can be detected by means of two cables connected to a voltmeter.

The temperature sensor, for example a thermocouple, can also be attached to the brush holder or sensor support.

Each of these sensors is advantageously connected to the data management system, in particular via the connection member.

The invention claimed is:

1. Current sensor device for monitoring the current passing through a brush, comprising:
a brush holder extending in a longitudinal direction between distal and proximal ends, and defining a through housing intended to receive, slidably in the longitudinal direction, a brush so that one end of the brush intended to brush against a rotating movable surface protrudes from the brush holder at its distal end,
a Hall effect sensor arranged to detect a magnetic field,
a concentrator arranged to concentrate the magnetic fields inside a concentrated magnetic field zone and to protect this zone from the external magnetic fields, wherein
the concentrator is mounted on the brush holder so as to surround at least a part of the brush when the latter is received inside the housing of the brush holder, in particular in a plane perpendicular to the longitudinal direction,
the Hall effect sensor is mounted on the brush holder at a position located inside the concentrated magnetic field zone, so as to measure a value representative of the intensity of the current passing through the brush when the latter is received in the housing of the brush holder.

2. Current sensor device according to claim 1, wherein the concentrator and the Hall effect sensor are located at a position closer to the distal end then the proximal end of the brush holder in the longitudinal direction.

3. Current sensor device according to claim 1, wherein the housing has a cross section in the form of a quadrilateral in a plane extending perpendicularly to the longitudinal direction of the brush holder, and the concentrator surrounds the brush when the latter is received inside the housing on at least three sides of the quadrilateral shape of the housing in this same plane.

4. Current sensor device according to claim 1, wherein the Hall effect sensor is attached to a sensor support located inside a casing mounted on the brush holder.

5. Current sensor device according to claim 4, wherein at least one element selected from the casing and the sensor holder is mounted removably.

6. Current sensor device according to claim 4, wherein the sensor support is, or comprises, an integrated circuit board, the latter comprising at least one microprocessor or microcontroller for analyzing the data supplied by the Hall effect sensor.

7. Current sensor device according to claim 6, further comprising a connection member arranged to collect and transmit, to a data management system, the data analyzed by the at least one microprocessor or microcontroller.

8. Current sensor device according to claim 1, wherein the concentrator is attached to the brush holder by means of a support element attached to the brush holder.

9. Current sensor device according to claim 1, comprising at least one of the following features:
the brush holder defines at least one holding member cooperating with a holding member of at least one element selected from the concentrator, the casing and the support element,
the casing defines at least one holding member cooperating with a holding member of at least one element selected from the concentrator and the support element,
the support element defines at least one holding member cooperating with a holding member of at least one element selected from the brush holder, the concentrator and the casing.

10. Current sensor device according to claim 1, wherein the length of the concentrator in the longitudinal direction represents 50% or less of the length of the brush holder, optionally from the distal end of the brush holder.

11. Current sensor device according to claim 1, wherein the length of the concentrator in the longitudinal direction is equal to or greater than the corresponding length of the Hall effect sensor, optionally the sensor is at a position located in at least one midplane with respect to the concentrator, this midplane being selected from a midplane parallel to the longitudinal direction and a midplane perpendicular thereto.

12. Current sensor device according to claim 1, wherein the concentrator is made from ferromagnetic material.

13. Current sensor device according to claim 1, comprising at least one other sensor arranged to measure at least one parameter associated with the state of the brush.

14. Rotating electrical machine comprising at least one current sensor device according to claim 1.

15. Method for assembling a current sensor device for monitoring the current of a brush, comprising:
    providing a brush holder extending in a longitudinal direction between distal and proximal ends, and defining a through housing intended to receive, slidably in the longitudinal direction, a brush so that an end of the brush intended to slide against a rotating movable surface protrudes from the brush holder at its distal end,
    mounting a concentrator, arranged to concentrate the magnetic fields inside a concentrated magnetic field zone and to protect this zone from the external magnetic fields, on the brush holder so as to surround at least part of the brush when the latter is received inside the housing of the brush holder, in particular in a plane perpendicular to the longitudinal direction, so that the magnetic field generated by the current flow passing through the brush received in the housing of the brush holder is concentrated by the concentrator in a concentrated magnetic field zone,
    mounting on the brush holder a Hall effect sensor arranged to detect a magnetic field, at a position located inside the concentrated magnetic field zone, so as to measure a value representative of the intensity of the current passing through the brush.

16. Assembly method according to claim 15, wherein the mounting of the Hall effect sensor comprises:
    attaching the Hall effect sensor to a sensor support,
    mounting the sensor support inside a casing,
    mounting the casing on the brush holder.

* * * * *